US012562774B2

(12) United States Patent
Nagumo

(10) Patent No.: US 12,562,774 B2
(45) Date of Patent: Feb. 24, 2026

(54) RADIO FREQUENCY CIRCUIT, COMMUNICATION DEVICE, AND CONTROL METHOD

(71) Applicant: Murata Manufacturing Co., Ltd., Nagaokakyo (JP)

(72) Inventor: Shoji Nagumo, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 330 days.

(21) Appl. No.: 18/530,301

(22) Filed: Dec. 6, 2023

(65) Prior Publication Data

US 2024/0128995 A1 Apr. 18, 2024

Related U.S. Application Data

(63) Continuation of application No. PCT/JP2022/020046, filed on May 12, 2022.

(30) Foreign Application Priority Data

Jun. 9, 2021 (JP) ................................. 2021-096709

(51) Int. Cl.
*H03F 3/24* (2006.01)
*H04B 1/401* (2015.01)
*H04B 7/0413* (2017.01)
(52) U.S. Cl.
CPC ............. *H04B 1/401* (2013.01); *H03F 3/245* (2013.01); *H03F 2200/165* (2013.01);
(Continued)
(58) Field of Classification Search
CPC ........ H04B 1/401; H04B 7/0413; H04B 1/40; H04B 7/0613; H04B 1/04; H03F 3/24; H03F 3/245
See application file for complete search history.

(56) References Cited

U.S. PATENT DOCUMENTS 10,554,244 B2 * 2/2020 Bai .......................... H04B 1/48
11,223,456 B2 * 1/2022 Manolakos .......... H04B 7/0456
2015/0133067 A1 5/2015 Chang et al.

FOREIGN PATENT DOCUMENTS

JP 2008-072403 A 3/2008
JP 2021-505054 A 2/2021
(Continued)

OTHER PUBLICATIONS

3rd Generation Partnership Project, "Technical Specification Group Radio Access Network; NR; User Equipment (UE) radio transmission and reception; Part 3: Range 1 and Range 2 Interworking operation with other radios (Release 17)", 3GPP TS 38.101-3, Version 17.1.0, Mar. 2021, 716 pages.
(Continued)

*Primary Examiner* — Tuan H Nguyen
(74) *Attorney, Agent, or Firm* — XSENSUS LLP

(57) ABSTRACT

A radio frequency circuit that supports simultaneous communication using downlink MIMO in a first band and uplink communication in a second band includes first and second power amplifiers connected to first and second antenna terminals, respectively. When a first SRS in the first band is output through the first antenna terminal, the first power amplifier amplifies the first SRS, according to a first deterioration amount of a signal-to-noise ratio in the first band due to distortion of a transmission signal in the second band having leaked in through the first antenna terminal, and when a second SRS in the first band is output through the second antenna terminal, the second power amplifier amplifies the second SRS, according to a second deterioration amount of the signal-to-noise ratio in the first band due to distortion of the transmission signal in the second band having leaked in through the second antenna terminal.

20 Claims, 9 Drawing Sheets

(52) U.S. Cl.
CPC .. *H03F 2200/171* (2013.01); *H03F 2200/294*
(2013.01); *H03F 2200/451* (2013.01); *H04B*
*7/0413* (2013.01)

(56) References Cited

FOREIGN PATENT DOCUMENTS

| | | |
|---|---|---|
| JP | 2021-514163 A | 6/2021 |
| WO | 2006/098379 A1 | 9/2006 |

OTHER PUBLICATIONS

International Search Report and Written Opinion mailed on Aug. 16, 2022, received for PCT Application PCT/JP2022/020046, filed on May 12, 2022, 08 pages including English Translation.

* cited by examiner

FIG. 1

| Antenna | Deterioration amount |
|---------|---------------------|
| 2a | −26 dB |
| 2b | −6 dB |

| First band | First antenna | Second band | Second antenna | Deterioration amount |
|---|---|---|---|---|
| A | 2a | B | 2c | −26 dB |
| A | 2b | B | 2c | −6 dB |
| A | 2d | B | 2c | −16 dB |
| A | 2e | B | 2c | −3 dB |
| A | 2a | B | 2f | −16 dB |
| A | 2b | B | 2f | −3 dB |
| A | 2d | B | 2f | −26 dB |
| A | 2e | B | 2f | −6 dB |

RADIO FREQUENCY CIRCUIT, COMMUNICATION DEVICE, AND CONTROL METHOD

CROSS-REFERENCE TO RELATED APPLICATIONS

This is a continuation application of PCT International Application No. PCT/JP2022/020046 filed on May 12, 2022, designating the United States of America, which is based on and claims priority to Japanese Patent Application No. 2021-096709 filed on Jun. 9, 2021. The entire disclosures of the above-identified applications, including the specifications, drawings, and claims are incorporated herein by reference in their entirety.

TECHNICAL FIELD

The present disclosure relates to a radio frequency circuit, a communication device, and a control method.

BACKGROUND

With regard to mobile communication devices such as mobile phones, support for simultaneous communication by a single terminal device using a plurality of communication systems and/or a plurality of bands has been growing, in addition to multi-mode technology that allows a single terminal device to support a plurality of communication systems and multi-band technology that allows a single terminal device to support a plurality of bands. For example, Patent Literature (PTL) 1 (US Patent Application Publication No. 2015/0133067) discloses a front-end module that supports carrier aggregation (CA).

Furthermore, support for Multiple Input Multiple Output (MIMO) that allows multi-path propagation using a plurality of antennas has also been growing.

SUMMARY

Technical Problems

However, as recognized by the present inventor, with the above conventional technology, when downlink MIMO (DL-MIMO) and uplink communication in another band are simultaneously used, communication quality of DL-MIMO may deteriorate due to distortion of signals in other bands that occurs in user equipment.

In view of this, the present disclosure provides a radio frequency circuit, a communication device, and a control method that can effectively exhibit performance of DL-MIMO when DL-MIMO and uplink communication in another band are simultaneously used.

Solutions

A radio frequency circuit according to an exemplary aspect of the present disclosure is a radio frequency circuit configured to support simultaneous communication using downlink Multiple Input Multiple Output (MIMO) in a first band and uplink communication in a second band, the radio frequency circuit including: a first power amplifier connected to a first antenna connection terminal; a second power amplifier connected to a second antenna connection terminal; a first low-noise amplifier connected to the first antenna connection terminal; and a second low-noise amplifier connected to the second antenna connection terminal.

Under a condition that a first sounding reference signal in the first band is output through the first antenna connection terminal, the first power amplifier is configured to amplify the first sounding reference signal, according to a first deterioration amount of a signal-to-noise ratio in the first band due to distortion of a transmission signal in the second band that has leaked in through the first antenna connection terminal. Under a condition that a second sounding reference signal in the first band is output through the second antenna connection terminal, the second power amplifier is configured to amplify the second sounding reference signal, according to a second deterioration amount of the signal-to-noise ratio in the first band due to the distortion of the transmission signal in the second band that has leaked in through the second antenna connection terminal.

The Specification and the drawings clarify further benefits and advantages that the disclosed embodiments provide. Such benefits and advantages may be individually produced by various embodiments and features of the Specification and drawings, and thus it is unnecessary to provide all in order to gain one or more of the benefits and advantages.

Advantageous Effects

According to a radio frequency circuit according to an aspect of the present disclosure, performance of DL-MIMO can be effectively improved when DL-MIMO and uplink communication in another band are simultaneously used.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1 illustrates a circuit configuration of a radio frequency circuit and a communication device according to an exemplary embodiment, Embodiment 1.

FIG. 4 illustrates a circuit configuration showing a connected state of the radio frequency circuit for transmitting a first sounding reference signal through a first antenna connection terminal in Embodiment 1.

FIG. 5 illustrates a circuit configuration showing a connected state of the radio frequency circuit for transmitting a second sounding reference signal through a second antenna connection terminal in Embodiment 1.

Figure 6:
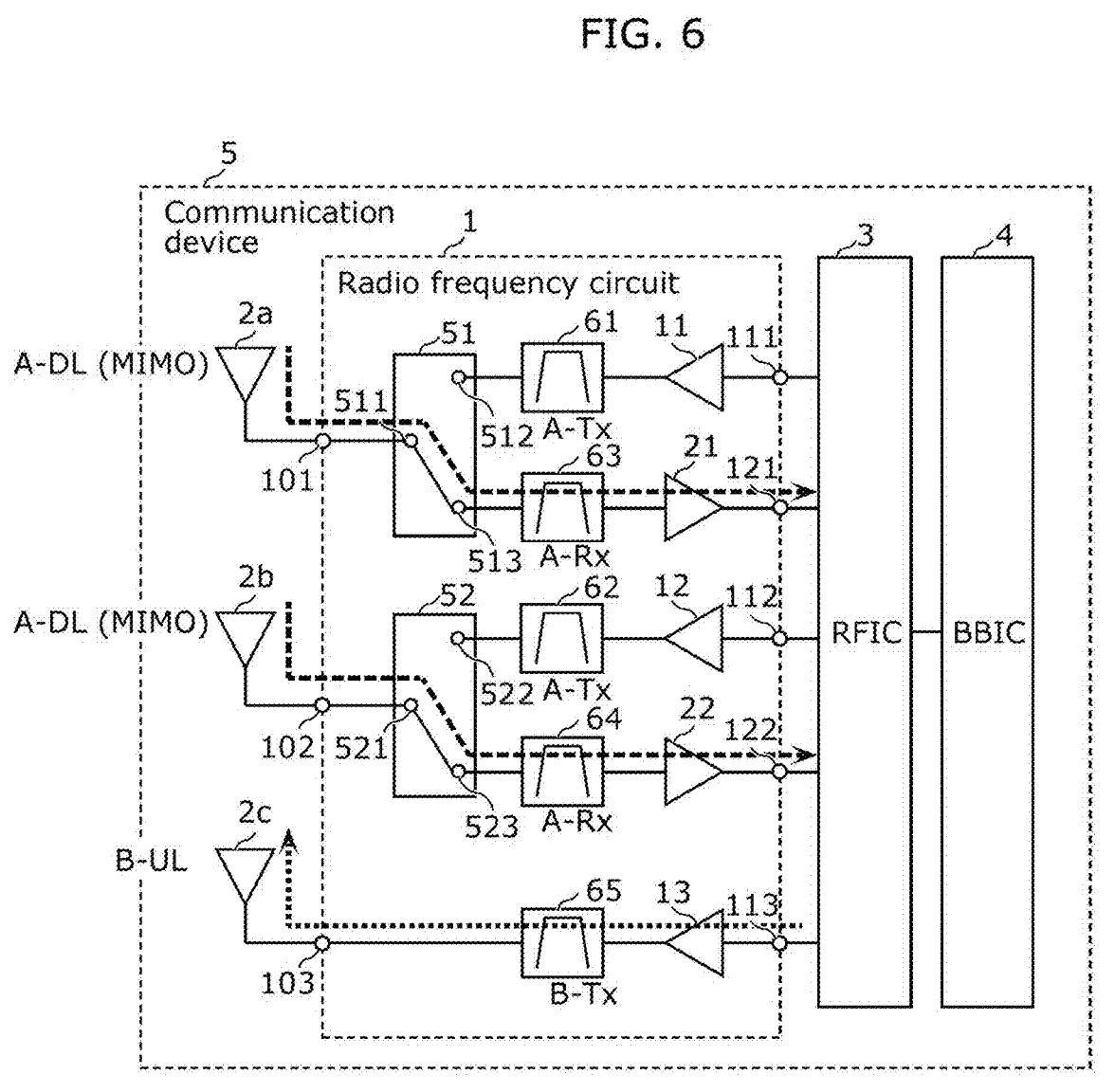

FIG. 6 illustrates a circuit configuration showing a connected state of radio frequency circuit 1 for DL-MIMO in Embodiment 1.

FIG. 7 illustrates a circuit configuration of a radio frequency circuit and a communication device according to Variation 1 of Embodiment 1.

FIG. 8 illustrates a circuit configuration of a radio frequency circuit and a communication device according to Variation 2 of Embodiment 1.

FIG. 10 illustrates an example of information stored in a storage medium in Embodiment 2.

DESCRIPTION OF EMBODIMENTS

Figures 2, 3:
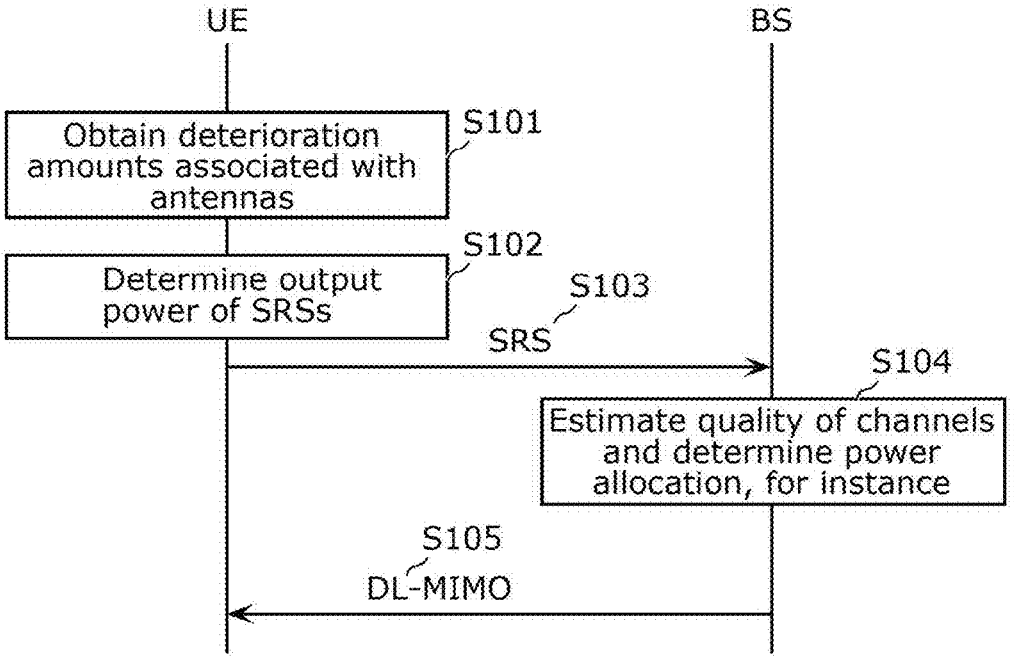
FIG. 2 is a sequence diagram illustrating interaction between a user terminal device and a base station according to Embodiment 1 and another exemplary embodiment, Embodiment 2.
FIG. 3 illustrates an example of information stored in a storage medium in Embodiment 1.

The following describes in detail exemplary embodiments of the present disclosure with reference to the drawings. Note that the embodiments described below each show a general or particular example. The numerical values, shapes, materials, elements, and the arrangement and connection of the elements, for instance, described in the following embodiments are examples, and thus are not intended to limit the present disclosure.

Note that the drawings are schematic diagrams to which emphasis, omission, and ratio adjustment are appropriately added in order to illustrate the present disclosure, and thus are not necessarily accurate illustrations. The drawings may show shapes, positional relations, and ratios that are different from the actual ones. In the drawings, the same reference designator is given to substantially the same element, and redundant description may be omitted or simplified.

In the circuit configuration of the present disclosure, "being connected" includes not only when being directly connected by a connection terminal and/or a line conductor, but also when being electrically connected via another circuit element. "Being connected between A and B" means being connected between A and B and to both of A and B, and also includes being connected between the ground and a path that connects A and B, in addition to being connected in series to the path.

Embodiment 1

1.1 Circuit Configuration of Radio Frequency Circuit 1 and Communication Device 5

Figure 1:
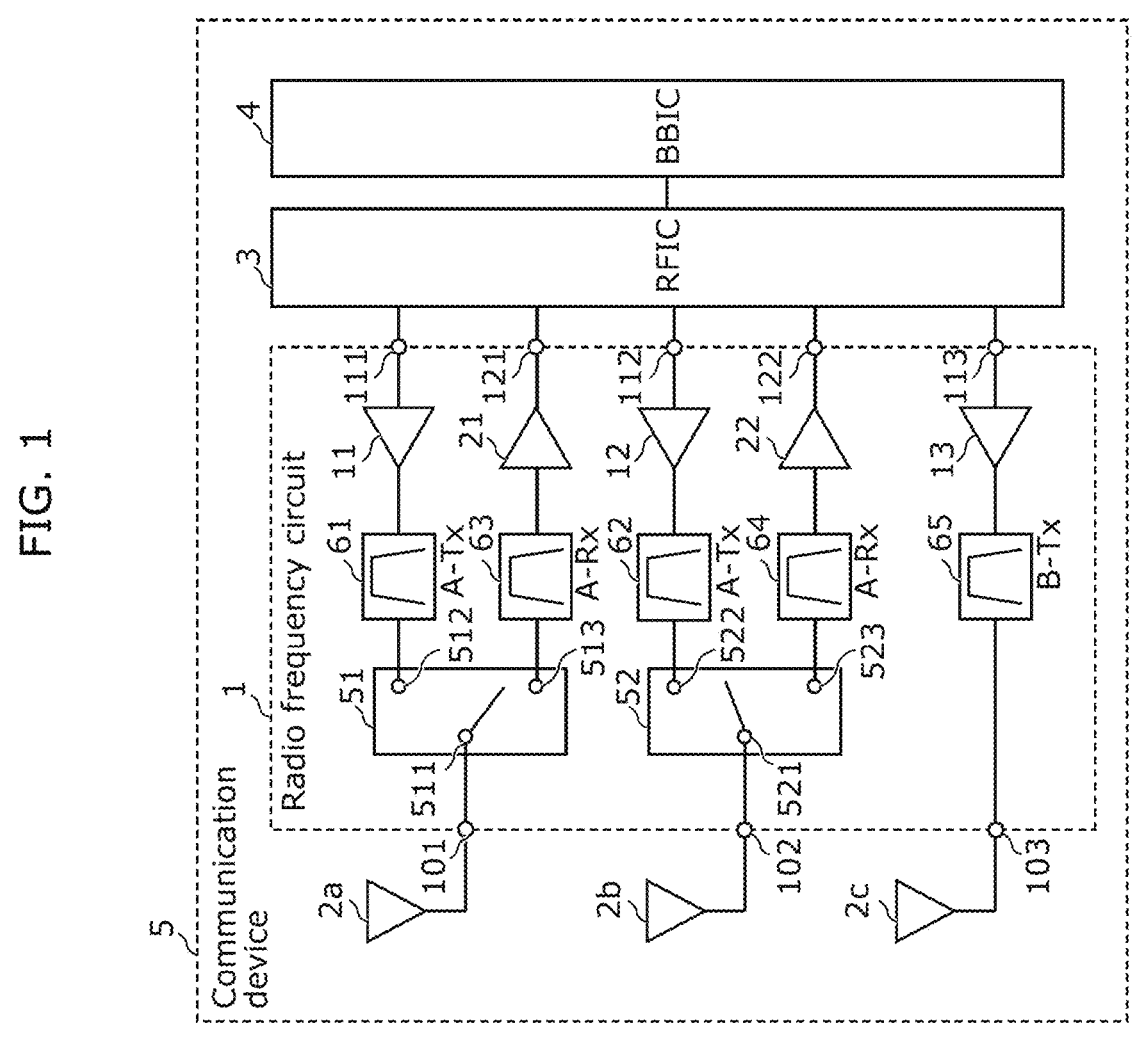

A circuit configuration of radio frequency circuit 1 according to Embodiment 1 and communication device 5 that includes radio frequency circuit 1 is to be described with reference to FIG. 1. FIG. 1 illustrates a circuit configuration of radio frequency circuit 1 and communication device 5 according to the exemplary embodiment.

1.1.1 Circuit Configuration of Communication Device 5

First, a circuit configuration of communication device 5 is to be described. Communication device 5 is an example of user equipment (UE) or a mobile station (MS), and supports simultaneous communication using 2×2 Downlink Multiple Input Multiple Output (DL-MIMO) in band A and uplink communication in band B.

As illustrated in FIG. 1, communication device 5 includes radio frequency circuit 1, antennas 2a to 2c, radio frequency integrated circuit (RFIC) 3, and baseband integrated circuit (BBIC) 4.

Radio frequency circuit 1 transfers radio frequency signals between RFIC 3 and antennas 2a to 2c. An internal circuit configuration of radio frequency circuit 1 is to be described later.

Antennas 2a to 2c are connected to antenna connection terminals 101 to 103 of radio frequency circuit 1, respectively. Antennas 2a to 2c receive radio frequency signals from radio frequency circuit 1 and output the radio frequency signals to the outside of communication device 5 and/or receive radio frequency signals from the outside of communication device 5 and output the radio frequency signals to radio frequency circuit 1.

RFIC 3 is an example of a signal processing circuit that processes radio frequency signals. Specifically, RFIC 3 processes radio frequency reception signals input through a reception path of radio frequency circuit 1 by down-conversion, for instance, and outputs reception signals generated by being processed to BBIC 4. RFIC 3 includes a controller that controls switch circuits and amplifier circuits, for instance, that are included in radio frequency circuit 1. Note that one or more or all of the functions of RFIC 3 as a controller may be provided outside RFIC 3, and may be provided in BBIC 4 or radio frequency circuit 1, for example.

BBIC 4 is a base band signal processing circuit that processes signals using an intermediate frequency band lower in frequency than radio frequency signals transferred by radio frequency circuit 1. A signal processed by BBIC 4 is used, for example, as an image signal for image display and/or as an audio signal for talk through a loudspeaker.

Note that antennas 2a to 2c and BBIC 4 are not necessarily included in communication device 5 according to the exemplary embodiment.

1.1.2 Circuit Configuration of Radio Frequency Circuit 1

Next, a circuit configuration of radio frequency circuit 1 is to be described. Radio frequency circuit 1 supports simultaneous communication using 2×2 DL-MIMO in band A and uplink communication in band B. As illustrated in FIG. 1, radio frequency circuit 1 includes power amplifiers 11 to 13, low-noise amplifiers 21 and 22, switches 51 and 52, filters 61 to 65, antenna connection terminals 101 to 103, radio frequency input terminals 111 to 113, and radio frequency output terminals 121 and 122.

Antenna connection terminal 101 is an example of a first antenna connection terminal, and is connected to antenna 2a outside radio frequency circuit 1. Antenna connection terminal 102 is an example of a second antenna connection terminal, and is connected to antenna 2b outside radio frequency circuit 1. Antenna connection terminal 103 is an example of a third antenna connection terminal, and is connected to antenna 2c outside radio frequency circuit 1.

Radio frequency input terminals 111 to 113 are for receiving radio frequency transmission signals from the outside of radio frequency circuit 1. Radio frequency input terminals 111 to 113 are connected to RFIC 3 outside radio frequency circuit 1. In the exemplary embodiment, radio frequency input terminals 111 and 112 can receive sounding reference signals (SRSs) in band A from RFIC 3. Note that the signals received by radio frequency input terminals 111 and 112 from RFIC 3 are not limited to SRSs. Radio frequency input terminal 113 can receive transmission signals in band B from RFIC 3.

An SRS is a reference signal transmitted from UE to a base station (BS) through each antenna in order to measure channel quality. The BS estimates channel quality that includes, for instance, a space propagation status (a channel matrix) using the SRS received from the UE, and determines various parameters (such as a precoding weight and channel power allocation, for example) used in DL-MIMO (for example, refer to PTL 2 (Japanese Unexamined Patent Application Publication No. 2008-72403) and PTL 3 (International Publication WO 2006/098379)).

Radio frequency output terminals 121 and 122 are for providing radio frequency reception signals to the outside of radio frequency circuit 1. In the exemplary embodiment, radio frequency output terminals 121 and 122 are connected to RFIC 3 outside radio frequency circuit 1.

Power amplifier 11 is an example of a first power amplifier, and is connected to antenna connection terminal 101 via filter 61 and switch 51. Specifically, the input end of power amplifier 11 is connected to radio frequency input terminal 111, whereas the output end of power amplifier 11 is connected to filter 61. Power amplifier 11 can amplify transmission signals in band A.

Power amplifier 12 is an example of a second power amplifier, and is connected to antenna connection terminal 102 via filter 62 and switch 52. Specifically, the input end of power amplifier 12 is connected to radio frequency input terminal 112, whereas the output end of power amplifier 12 is connected to filter 62. Power amplifier 12 can amplify transmission signals in band A.

Power amplifier 13 is an example of a third power amplifier, and is connected to antenna connection terminal 103 via filter 65. Specifically, the input end of power amplifier 13 is connected to radio frequency input terminal 113, whereas the output end of power amplifier 13 is connected to filter 65. Power amplifier 13 can amplify transmission signals in band B.

Power amplifiers 11 to 13 are electronic components that obtain output signals having greater energy than input signals (transmission signals), based on power supplied from a power source. Power amplifiers 11 to 13 may each include an amplifying transistor, and may further include an inductor and/or a capacitor. In the exemplary embodiment, an internal configuration of power amplifiers 11 to 13 is not limited in particular. For example, power amplifiers 11 to 13 may be multistage amplifiers, differential amplifying-type amplifiers, or Doherty amplifiers.

Low-noise amplifier 21 is an example of a first low-noise amplifier, and is connected to antenna connection terminal 101 via filter 63 and switch 51. Specifically, the input end of low-noise amplifier 21 is connected to filter 63, whereas the output end of low-noise amplifier 21 is connected to radio frequency output terminal 121. Low-noise amplifier 21 can amplify reception signals in band A.

Low-noise amplifier 22 is an example of a second low-noise amplifier, and is connected to antenna connection terminal 102 via filter 64 and switch 52. Specifically, the input end of low-noise amplifier 22 is connected to filter 64, whereas the output end of low-noise amplifier 22 is connected to radio frequency output terminal 122. Low-noise amplifier 22 can amplify reception signals in band A.

Switch 51 is an example of a first switch, and is connected between antenna connection terminal 101 and filters 61 and 63. Specifically, switch 51 includes terminals 511 to 513. Terminal 511 is connected to antenna connection terminal 101. Terminal 512 is connected to filter 61. Terminal 513 is connected to filter 63.

With this connection configuration, switch 51 can connect terminal 511 to any one of terminal 512 or terminal 513, based on a control signal from RFIC 3, for example. Thus, switch 51 can switch connection of antenna connection terminal 101 between filters 61 and 63. For example, a single-pole double-throw (SPDT) switch circuit can be used as switch 51.

Switch 52 is an example of a second switch, and is connected between antenna connection terminal 102 and filters 62 and 64. Specifically, switch 52 includes terminals 521 to 523. Terminal 521 is connected to antenna connection terminal 102. Terminal 522 is connected to filter 62. Terminal 523 is connected to filter 64.

With this connection configuration, switch 52 can connect terminal 521 to terminal 522 or 523, based on a control signal from RFIC 3, for example. Thus, switch 52 can switch connection of antenna connection terminal 102 between filters 62 and 64. For example, an SPDT switch circuit can be used as switch 52.

Filter 61 (A-Tx) is an example of a first filter, and has a passband that includes at least a portion of band A. For example, assuming band A is a band for time division duplex (TDD), the passband of filter 61 includes band A. For example, assuming band A is a band for frequency division duplex (FDD), the passband of filter 61 includes the uplink operating band in band A. Filter 61 is connected between antenna connection terminal 101 and power amplifier 11. Specifically, an end of filter 61 is connected to terminal 512 of switch 51, and the other end of filter 61 is connected to the output end of power amplifier 11. Filter 61 can pass transmission signals in band A, which are amplified by power amplifier 11.

Filter 62 (A-Tx) is an example of a second filter, and has a passband that includes at least a portion of band A. For example, assuming band A is a band for TDD, the passband of filter 62 includes band A. For example, assuming band A is a band for FDD, the passband of filter 62 includes the uplink operating band in band A. Filter 62 is connected between antenna connection terminal 102 and power amplifier 12. Specifically, an end of filter 62 is connected to terminal 522 of switch 52, and the other end of filter 62 is connected to the output end of power amplifier 12. Filter 62 can pass transmission signals in band A, which are amplified by power amplifier 12.

Filter 63 (A-Rx) is an example of a third filter, and has a passband that includes at least a portion of band A. For example, assuming band A is a band for TDD, the passband of filter 63 includes band A. For example, assuming band A is a band for FDD, the passband of filter 63 includes the downlink operating band in band A. Filter 63 is connected between switch 51 and low-noise amplifier 21. Specifically, an end of filter 63 is connected to terminal 513 of switch 51, and the other end of filter 63 is connected to the input end of low-noise amplifier 21. Filter 63 can pass reception signals in band A, which are received by antenna 2a.

Filter 64 (A-Rx) is an example of a fourth filter, and has a passband that includes at least a portion of band A. For example, assuming band A is a band for TDD, the passband of filter 64 includes band A. For example, assuming band A is a band for FDD, the passband of filter 64 includes the downlink operating band in band A. Filter 64 is connected between switch 52 and low-noise amplifier 22. Specifically, an end of filter 64 is connected to terminal 523 of switch 52, and the other end of filter 64 is connected to the input end of low-noise amplifier 22. Filter 64 can pass reception signals in band A, which are received by antenna 2b.

Filter 65 (B-Tx) is an example of a fifth filter, and has a passband that includes at least a portion of band B. For example, assuming band B is a band for TDD, the passband of filter 65 includes band B. For example, assuming band B is a band for FDD, the passband of filter 65 includes the uplink operating band in band B. Filter 65 is connected between antenna connection terminal 103 and power amplifier 13. Specifically, an end of filter 65 is connected to antenna connection terminal 103, and the other end of filter 65 is connected to the output end of power amplifier 13. Filter 65 can pass transmission signals in band B, which are amplified by power amplifier 13.

Filters 61 to 65 may each include any of, for example, a surface acoustic wave (SAW) filter, a bulk acoustic wave (BAW) filter, an inductor-capacitor (LC) resonant filter, and a dielectric filter and furthermore, the filters included therein are not limited to such filters.

1.2 Specific Examples of Bands A and B

Next, band A and band B are to be described. Bands A and B are frequency bands for a communication system established using radio access technology (RAT). Bands A and B are defined in advance by, for instance, a standardizing body (such as the Third Generation Partnership Project (3GPP (registered trademark) or the Institute of Electrical and Electronics Engineers (IEEE), for example. Examples of a communication system include a Fifth Generation New Radio (5G NR) system, a Long Term Evolution (LTE) system, and a Wireless Local Area Network (WLAN) system, for instance.

Specific examples of combinations of bands A and B that can be used are shown in Table 1 below.

TABLE 1

| No. | Band A (DL) | Band B (UL) |
| --- | --- | --- |
| 1 | n78 | Band 3 |
| 2 | n78 | Band 2 |
| 3 | n78 | Band 4 |
| 4 | n78 | Band 66 |
| 5 | n77 | Band 1 |
| 6 | n77 | Band 3 |
| 7 | n41 | Band 8 |
| 8 | n41 | Band 26 |

Note that combinations of bands A and B are not limited to the combinations shown in Table 1. For example, bands for TDD are used as band A, and bands for FDD are used as band B in Table 1, but bands A and B are not limited to these. For example, bands for FDD may be used as band A, and bands for TDD may be used as band B. In Table 1, bands for 5G NR are used as band A, and bands for LTE are used as band B, but bands A and B are not limited to these. For example, bands for LTE may be used as band A and/or bands for 5G NR may be used as band B. Further, bands or channels for WLAN may be used as band A and/or band B.

As a combination of bands A and B, a combination of a first band of 5 GHz or higher (for example, n46, n96, or n102 for 5G NR) and a second band whose harmonics interfere with the first band may be used. Note that a market for an unlicensed band (NR-U band) or a licensed band of 5 GHz or higher is not yet created, and thus problems with harmonics interference in carrier aggregation (CA) and E-UTRAN New Radio-Dual Connectivity (EN-DC) have not become apparent. Yet it is sufficiently possible that the combinations of bands A and B include such bands of 5 GHz or higher.

1.3 Operation of Communication Device 5

Next, operation of (that is, a communication method performed by) communication device 5 configured as above is to be described with reference to FIG. 2. Specifically, processing for establishing 2×2 DL-MIMO in band A is to be described. FIG. 2 is a sequence diagram illustrating interaction between UE and a BS according to the exemplary embodiment. Note that in this Specification, a "deterioration amount" of a signal-to-noise ratio (an S/N ratio) is expressed with − (minus), and description is given assuming that the greater the absolute value is, the greater the deterioration amount is. Isolation between antennas is also expressed with − (minus), and description is given assuming that the greater the absolute value is, the more the isolation improves.

First, the UE (that is, communication device 5) obtains deterioration amounts of the S/N ratio in band A due to distortion of a transmission signal in band B that has leaked in via antennas 2a and 2b (that is, antenna connection terminals 101 and 102, with reference to information on deterioration amounts of the S/N ratio stored in a storage medium (S101). The UE obtains −26 dB as a deterioration amount (a first deterioration amount) associated with antenna 2a, and obtains −6 dB as a deterioration amount (a second deterioration amount) associated with antenna 2b, with reference to, for example, the information as illustrated in FIG. 3.

FIG. 3 illustrates an example of information stored in a storage medium in the exemplary embodiment. In FIG. 3, −26 dB is recorded as a deterioration amount of the S/N ratio in band A due to distortion of a transmission signal in band B that has leaked in via antenna 2a, and −6 dB is recorded as a deterioration amount of the S/N ratio in band A due to distortion of a transmission signal in band B that has leaked in via antenna 2b.

The storage medium is not illustrated, but may be included in communication device 5. For example, the storage medium may be included in BBIC 4, or may be included in RFIC 3 or radio frequency circuit 1. Further, the storage medium may be independently mounted in communication device 5 or may be detachably provided in communication device 5. As the storage medium, for example, nonvolatile semiconductor memory can be used, but the storage medium is not limited thereto. Note that the storage medium may be a read-only medium or may be a rewritable medium.

The deterioration amount of the S/N ratio can be derived based on the magnitude of distortion (second harmonic distortion, for example) of a transmission signal in band B and isolation between antennas. For example, assuming a noise level of a reception path for band A before distortion of a transmission signal in band B has leaked in is −101 dBm, the magnitude of second harmonic distortion of the transmission signal in band B is −65 dBm, and isolation between antennas 2a and 2c is −10 dB, a deterioration amount of the S/N ratio in band A due to distortion of the transmission signal in band B that has leaked in via antenna 2a can be derived as −26 dB (=−101−1(−65−10)). For example, assuming a noise level of a reception path for band A before distortion of a transmission signal in band B has leaked in is −101 dBm, the magnitude of second harmonic distortion of the transmission signal in band B is −65 dBm, and isolation between antennas 2b and 2c is −30 dB, a deterioration amount of the S/N ratio in band A due to distortion of the transmission signal in band B that has leaked in via antenna 2a can be derived as −6 dB (=−101−(−65−30)).

Note that distortion of a transmission signal in band B is not limited to harmonic distortion. For example, distortion of a transmission signal in band B may be intermediation distortion between band B and another band. At this time, the other band may be band A or a band different from band A. At this time, for each combination of band B and another band, a deterioration amount of the S/N ratio associated therewith may be stored in the storage medium.

The UE determines, according to the obtained deterioration amount, output power of an SRS to be transmitted via one of the antennas associated therewith (S102). For example, the UE determines the output power of the SRS to have less output power with an increase in the deterioration amount. At this time, assuming a deterioration amount (a first deterioration amount) associated with antenna 2a is greater than a deterioration amount (a second deterioration amount) associated with antenna 2b, the output power of a first SRS transmitted via antenna 2a is less than the output power of a second SRS transmitted via antenna 2b. On the other hand, assuming a deterioration amount (the first deterioration amount) associated with antenna 2a is less than a deterioration amount (the second deterioration amount) associated with antenna 2b, the output power of the first SRS transmitted via antenna 2a is greater than the output power of the second SRS transmitted via antenna 2b.

The output power of an SRS can be expressed as function f(x) of deterioration amount x of an S/N ratio. At this time, function f(x) may be a strictly monotonically decreasing function or a weakly monotonically decreasing function. Note that assuming function f(x) is a weakly monotonically decreasing function, the domain of function f(x) can include a range in which output power does not change even assuming the deterioration amount increases.

For example, the UE determines output power of an SRS to have a value obtained by attenuating predetermined output power by power according to the deterioration amount. In this case, assuming the predetermined output power of the SRS is 20 dBm and the deterioration amount of the S/N ratio in band A at antenna 2a is −26 dB, −6 dBm (=20−26) is determined to be output power of the SRS. Furthermore, assuming the deterioration amount of the S/N ratio in band A at antenna 2b is −6 dB, 14 dBm (=20−6) is determined to be output power of the SRS.

At this time, output power for an SRS defined in advance by a standard, for example, can be used as the predetermined output power. Further, output power designated by the BS, for example, may be used as the predetermined output power.

Output power means power of a transmission signal at an antenna end of the UE. The output power of the UE is measured by using a method defined by the 3GPP, for example. Specifically, the output power of an SRS transmitted via antenna 2a is measured by measuring radiant power at antenna 2a in FIG. 1, for example. Note that instead of measuring radiant power, a terminal is provided in the vicinity of antenna 2a and a measuring instrument (such as a spectral analyzer, for example) is connected to the terminal, so that output power of an SRS transmitted via antenna 2a can also be measured.

Note that the UE may determine, instead of output power, the gain of a power amplifier for obtaining the output power.

Next, based on output power of an SRS determined for each antenna, the UE amplifies the SRS. The UE outputs the amplified SRS to the antenna via a corresponding one of the antenna connection terminals, to transmit the SRS to the BS (S103). Specifically, in response to a control signal from RFIC 3, radio frequency circuit 1 amplifies the first SRS using power amplifier 11 up to power corresponding to the determined output power, and outputs the amplified first SRS through antenna connection terminal 101. Further, in response to a control signal from RFIC 3, radio frequency circuit 1 amplifies the second SRS using power amplifier 12 up to power corresponding to the determined output power, and outputs the amplified second SRS through antenna connection terminal 102.

Accordingly, the UE transmits, to the BS, an SRS having output power according to a deterioration amount of the S/N ratio due to distortion of a transmission signal in band B that has leaked in via an antenna. Thus, assuming the deterioration amounts of the S/N ratio are different at antennas 2a and 2b, output power of an SRS transmitted from antenna 2a is different from output power of an SRS transmitted from antenna 2b.

The BS receives SRSs transmitted from the UE using different antennas, estimates quality of the channels based on the SRSs from the antennas, and determines, for instance, power allocation in DL-MIMO (S104). At this time, the output power of an SRS is attenuated according to a deterioration amount of the S/N ratio, and thus deterioration of the S/N ratio is reflected in the channel quality. Parameters (such as power allocation) for DL-MIMO are determined based such channel quality, and thus performance of DL-MIMO can be effectively improved in a situation where the S/N ratio deteriorates. Note that conventional methods (for example, refer to PTLs 1 and 2) can be used to estimate channel quality and determine parameters.

Finally, DL-MIMO is performed according to the determined power allocation (S105).

1.4 Connected State of Radio Frequency Circuit 1

Next, a connected state of radio frequency circuit 1 in transmission and reception of signals in communication device 5 described above is to be described with reference to FIG. 4 to FIG. 6.

Figure 4:
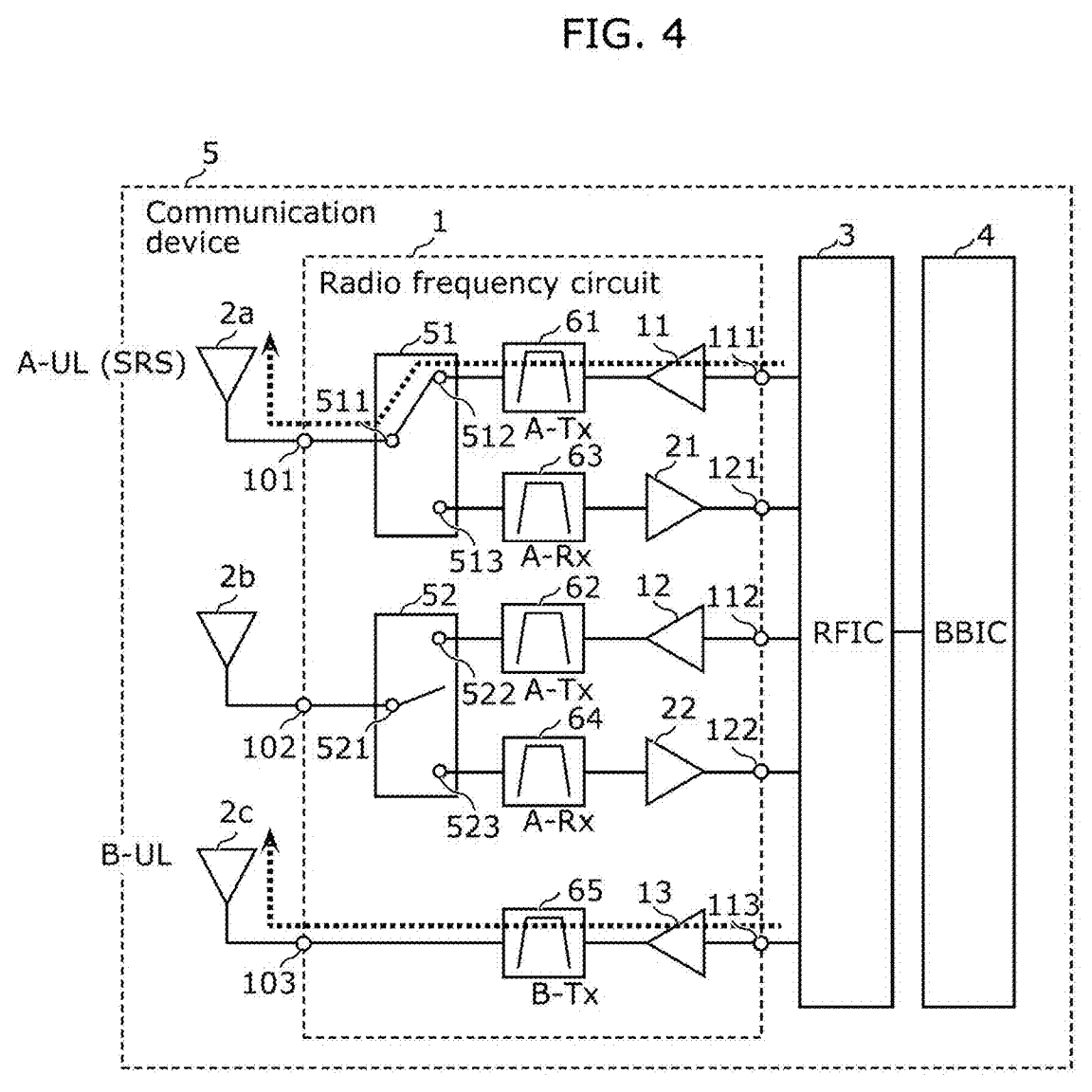

FIG. 4 illustrates a circuit configuration showing a connected state of radio frequency circuit 1 for transmitting an SRS via antenna 2a in the exemplary embodiment. Specifically, FIG. 4 illustrates a connected state of radio frequency circuit 1 that outputs the first SRS through antenna connection terminal 101 in step S103 in FIG. 2. Note that dashed arrows in FIG. 4 to FIG. 6 show flows of signals.

RFIC 3 can create the connected state in FIG. 4 by controlling the switches in radio frequency circuit 1. In this connected state, switch 51 connects terminal 511 to terminal 512.

As a result, an SRS in band A is transferred from RFIC 3 to antenna 2a through radio frequency input terminal 111, power amplifier 11, filter 61, switch 51, and antenna connection terminal 101 (A-UL (SRS)). Furthermore, an uplink signal in band B may be transferred from RFIC 3 to antenna 2c through power amplifier 13, filter 65, and antenna connection terminal 103 (B-UL).

Figure 5:
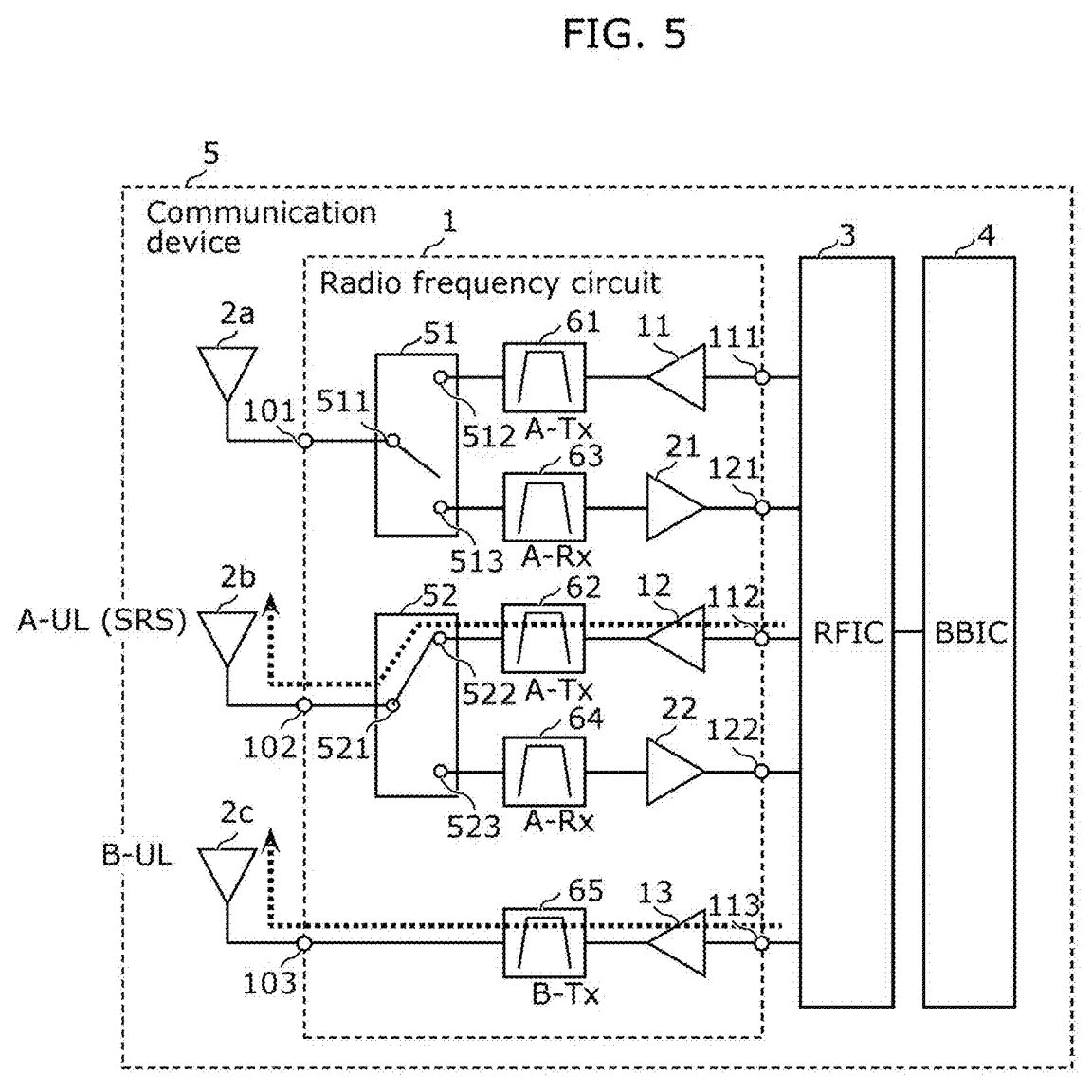

FIG. 5 illustrates a circuit configuration showing a connected state of radio frequency circuit 1 for transmitting an SRS via antenna 2b in the exemplary embodiment. Specifically, FIG. 5 illustrates a connected state of radio frequency circuit 1 that outputs the second SRS through antenna connection terminal 102 in step S103 in FIG. 2.

RFIC 3 can create the connected state in FIG. 5 by controlling the switches in radio frequency circuit 1. In this connected state, switch 52 connects terminal 521 to terminal 522.

As a result, an SRS in band A is transferred from RFIC 3 to antenna 2b through radio frequency input terminal 112, power amplifier 12, filter 62, switch 52, and antenna connection terminal 102 (A-UL (SRS)). Furthermore, an uplink signal in band B may be transferred from RFIC 3 to antenna 2c through power amplifier 13, filter 65, and antenna connection terminal 103 (B-UL).

FIG. 6 illustrates a circuit configuration showing a connected state of radio frequency circuit 1 for DL-MIMO in the exemplary embodiment. Specifically, FIG. 6 illustrates a connected state of radio frequency circuit 1 in step S105 in FIG. 2.

RFIC 3 can create the connected state in FIG. 6 by controlling the switches in radio frequency circuit 1. In this connected state, switch 51 connects terminal 511 to terminal 513, and switch 52 connects terminal 521 to terminal 523.

As a result, DL-MIMO signals in band A are transferred from antenna 2a to RFIC 3 through antenna connection terminal 101, switch 51, filter 63, low-noise amplifier 21, and radio frequency output terminal 121 and from antenna 2b to RFIC 3 through antenna connection terminal 102, switch 52, filter 64, low-noise amplifier 22, and radio frequency output terminal 122 (A-DL (MIMO)). Furthermore, an uplink signal in band B is transferred from RFIC 3 to antenna 2c through power amplifier 13, filter 65, and antenna connection terminal 103 (B-UL). Note that an uplink signal in band B may not be transferred.

At this time, distortion of the uplink signal in band B leaks into the reception paths of the DL-MIMO signals in band A via antennas 2a and 2b. However, in the exemplary embodiment, an SRS amplified according to deterioration of an S/N ratio due to distortion of the uplink signal in band B is transmitted from each antenna, and thus parameters for DL-MIMO taken in consideration of deterioration of the S/N ratio are used so that a decrease in communion quality of DL-MIMO in band A can be reduced.

1.5 Advantageous Effects and Others

As described above, radio frequency circuit 1 according to the exemplary embodiment is a radio frequency circuit configured to support simultaneous communication using DL-MIMO in band A and uplink communication in band B, radio frequency circuit 1 including: power amplifier 11 connected to antenna connection terminal 101; power amplifier 12 connected to antenna connection terminal 102; low-noise amplifier 21 connected to antenna connection terminal 101; and low-noise amplifier 22 connected to antenna connection terminal 102. Under a condition that a first SRS in band A is output through antenna connection terminal 101, power amplifier 11 is configured to amplify the first SRS, according to a first deterioration amount of an S/N ratio in band A due to distortion of a transmission signal in band B that has leaked in through antenna connection terminal 101. Under a condition that a second SRS in band A is output through antenna connection terminal 102, power amplifier 12 is configured to amplify the second SRS, according to a second deterioration amount of the S/N ratio in band A due to the distortion of the transmission signal in band B that has leaked in through antenna connection terminal 102.

According to this, the SRSs can be amplified according to the deterioration amounts of the S/N ratio in band A. Thus, the BS can reflect, in channel quality, deterioration of the S/N ratio in band A caused by the transmission signal in band B. As a result, parameters for DL-MIMO adjusted for deterioration of the S/N ratio can be used, and performance of DL-MIMO can be effectively improved in a situation in which the S/N ratio deteriorates.

For example, in radio frequency circuit 1 according to the exemplary embodiment, under a condition that the first deterioration amount is greater than the second deterioration amount, output power of the first SRS may be less than output power of the second SRS, and under a condition that the first deterioration amount is less than the second deterioration amount, the output power of the first SRS may be greater than the output power of the second SRS.

According to this, by decreasing the output power of the SRS that is output through an antenna associated with a greater deterioration amount of the S/N ratio, deterioration of the S/N ratio caused by a transmission signal in band B can be reflected in channel quality.

For example, in radio frequency circuit 1 according to the exemplary embodiment, power amplifier 11 may be configured to amplify the first SRS to decrease the output power of the first SRS with an increase in the first deterioration amount, and power amplifier 12 may be configured to amplify the second SRS to decrease the output power of the second SRS with an increase in the second deterioration amount.

According to this, the output power of an SRS can be decreased with an increase in the deterioration amount of the S/N ratio, and the deterioration of the S/N ratio can be reflected in channel quality.

For example, in radio frequency circuit 1 according to the exemplary embodiment, power amplifier 11 may be configured to amplify the first SRS to cause the output power of the first SRS to have a value obtained by attenuating predetermined output power by power corresponding to the first deterioration amount, and power amplifier 12 may be configured to amplify the second SRS to cause the output power of the second SRS to have a value obtained by attenuating the predetermined output power by power corresponding to the second deterioration amount.

According to this, an SRS having a value obtained by attenuating predetermined output power by power according to the deterioration amount can be transmitted, and the deterioration of the S/N ratio can be reflected in channel quality.

For example, in radio frequency circuit 1 according to the exemplary embodiment, information on the first deterioration amount and the second deterioration amount may be stored in a storage medium.

According to this, the first deterioration amount and the second deterioration amount can be readily obtained, based on the information stored in a storage medium.

For example, radio frequency circuit 1 according to the exemplary embodiment may further include: power amplifier 13 connected to antenna connection terminal 103; filters 61 to 64 each having a passband that includes at least a portion of band A; and filter 65 having a passband that includes at least a portion of band B. Power amplifier 11 may be connected to antenna connection terminal 101 via filter 61, power amplifier 12 may be connected to antenna connection terminal 102 via filter 62, low-noise amplifier 21 may be connected to antenna connection terminal 101 via filter 63, low-noise amplifier 22 may be connected to antenna connection terminal 102 via filter 64, and power amplifier 13 may be connected to antenna connection terminal 103 via filter 65.

According to this, isolation between the transmission paths and the reception paths can be improved.

For example, radio frequency circuit 1 according to the exemplary embodiment may further include: switch 51 connected between (i) antenna connection terminal 101 and (ii) filter 61 and filter 63; and switch 52 connected between (i) antenna connection terminal 102 and (ii) filter 62 and filter 64.

According to this, isolation between the transmission paths and the reception paths can be improved.

For example, in radio frequency circuit 1 according to the exemplary embodiment, band A may be n78 for 5G NR, and band B may be band 2, band 3, band 4, or band 66 for LTE. For example, in radio frequency circuit 1 according to the exemplary embodiment, band A may be n77 for 5G NR, and band B may be band 1 or band 3 for LTE. For example, in radio frequency circuit 1 according to the exemplary embodiment, band A may be n41 for 5G NR, and band B may be band 8 or band 26 for LTE.

According to this, assuming various types of bands for 5G NR and LTE are used, performance of DL-MIMO can be effectively improved in a situation in which the S/N ratio deteriorates.

For example, communication device 5 according to the exemplary embodiment includes: RFIC 3 configured to process a radio frequency signal; and radio frequency circuit 1 configured to transfer the radio frequency signal between RFIC 3 and antennas 2a to 2c.

According to this, the advantageous effects produced by radio frequency circuit 1 above can also be yielded by communication device 5.

A method for controlling communication device 5 according to the exemplary embodiment includes: obtaining a first deterioration amount of a signal-to-noise ratio in band A due to distortion of a transmission signal in band B that has leaked in through antenna connection terminal 101; amplifying a first SRS in band A, according to the first deterioration amount obtained; outputting the first SRS amplified through antenna connection terminal 101; obtaining a second deterioration amount of the signal-to-noise ratio in band A due to the distortion of the transmission signal in band B that has leaked in through antenna connection terminal 102; amplifying a second SRS in band A, according to the second deterioration amount obtained; and outputting the second SRS amplified through antenna connection terminal 102.

According to this, for each of antenna connection terminals 101 and 102, an SRS can be amplified according to a deterioration amount of the S/N ratio in band A, and the amplified SRS is output therethrough. Thus, the BS can reflect, in channel quality, deterioration of the S/N ratio in band A caused by the transmission signal in band B. As a result, parameters for DL-MIMO adjusted for deterioration of the S/N ratio can be used, and performance of DL-MIMO can be effectively improved in a situation in which the S/N ratio deteriorates.

Variation 1 of Embodiment 1

Next, Variation 1 of Embodiment 1 is to be described. This variation is different from Embodiment 1 above mainly in that a single power amplifier is used instead of two power amplifiers 11 and 12. The following describes this variation with reference to the drawings, focusing on differences from Embodiment 1 above.

2.1 Circuit Configuration of Radio Frequency Circuit 1A

Figure 7:
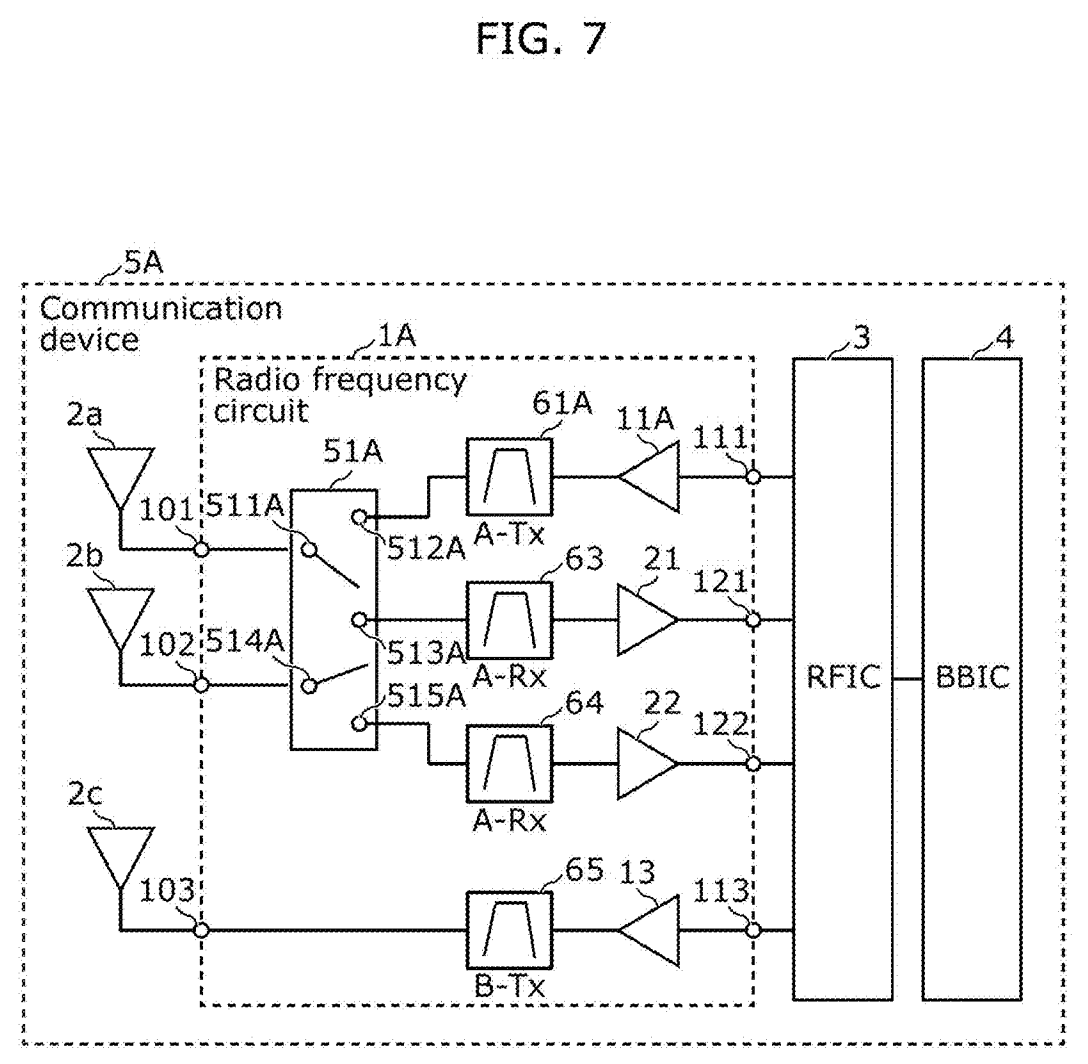

A circuit configuration of radio frequency circuit 1A according to this variation is to be described with reference to FIG. 7. FIG. 7 illustrates a circuit configuration of radio frequency circuit 1A and communication device 5A according to this variation. Note that a circuit configuration of communication device 5A is the same as that of communication device 5 according to Embodiment 1 except that radio frequency circuit 1A is included instead of radio frequency circuit 1, and thus description thereof is omitted.

As illustrated in FIG. 7, radio frequency circuit 1A according to this variation includes power amplifiers 11A and 13, low-noise amplifiers 21 and 22, switch 51A, filters 61A and 63 to 65, antenna connection terminals 101 to 103, radio frequency input terminals 111 and 113, and radio frequency output terminals 121 and 122.

Power amplifier 11A is an example of the first power amplifier and the second power amplifier, and functions as power amplifiers 11 and 12 in Embodiment 1 above. Power amplifier 11A is connected to antenna connection terminals 101 and 102 via filter 61A and switch 51A. Specifically, the input end of power amplifier 11A is connected to radio frequency input terminal 111, whereas the output end of power amplifier 11A is connected to filter 61A. Power amplifier 11A can amplify transmission signals in band A.

Switch 51A functions as switches 51 and 52 in Embodiment 1 above, and is connected between (i) antenna connection terminals 101 and 102 and (ii) filters 61A, 63, and 64. Specifically, switch 51A includes terminals 511A to 515A. Terminal 511A is connected to antenna connection terminal 101. Terminal 512A is connected to filter 61A. Terminal 513A is connected to filter 63. Terminal 514A is connected to antenna connection terminal 102. Terminal 515A is connected to filter 64.

With this connection configuration, switch 51A can connect each of terminals 511A and 514A to any one of terminals 512A, 513A, and 515A, based on a control signal from RFIC 3, for example. Thus, switch 51A can switch connection of antenna connection terminal 101 between filters 61A, 63, and 64, and can switch connection of antenna connection terminal 102 between filters 61A, 63, and 64.

For example, assuming an SRS in band A is transmitted via antenna 2a, switch 51A connects terminal 511A to terminal 512A. For example, assuming an SRS in band A is transmitted via antenna 2b, switch 51A connects terminal 514A to terminal 512A. For example, assuming DL-MIMO in band A is performed, switch 51A connects terminal 511A to terminal 513A, and connects terminal 514A to terminal 515A.

Filter 61A (A-Tx) is an example of the first filter and the second filter, and corresponds to filters 61 and 62 in Embodiment 1 above. Filter 61A has a passband that includes band A, and is connected between antenna connection terminal 101 and power amplifier 11A. Specifically, an end of filter 61A is connected to terminal 512A of switch 51A, and the other end of filter 61A is connected to the output end of power amplifier 11A.

Filter 61A can pass transmission signals in band A, which are amplified by power amplifier 11A.

2.2 Advantageous Effects and Others

As described above, in radio frequency circuit 1A according to this variation, power amplifier 11A is connected to antenna connection terminals 101 and 102 via filter 61A and switch 51A.

According to this, radio frequency circuit 1A can achieve functions of two power amplifiers 11 and 12 in Embodiment 1 above, by using single power amplifier 11A. Thus, the number of power amplifiers included in radio frequency circuit 1A can be decreased.

Variation 2 of Embodiment 1

Next, Variation 2 of Embodiment 1 is to be described. This variation is different from Embodiment 1 above mainly in that a transmission filter (A-Tx) for band A and a reception filter (A-Rx) for band A are mounted as a single transmission reception filter (A-TRx). The following describes this variation with reference to the drawings, focusing on differences from Embodiment 1 above.

3.1 Circuit Configuration of Radio Frequency Circuit 1B

Figure 8:
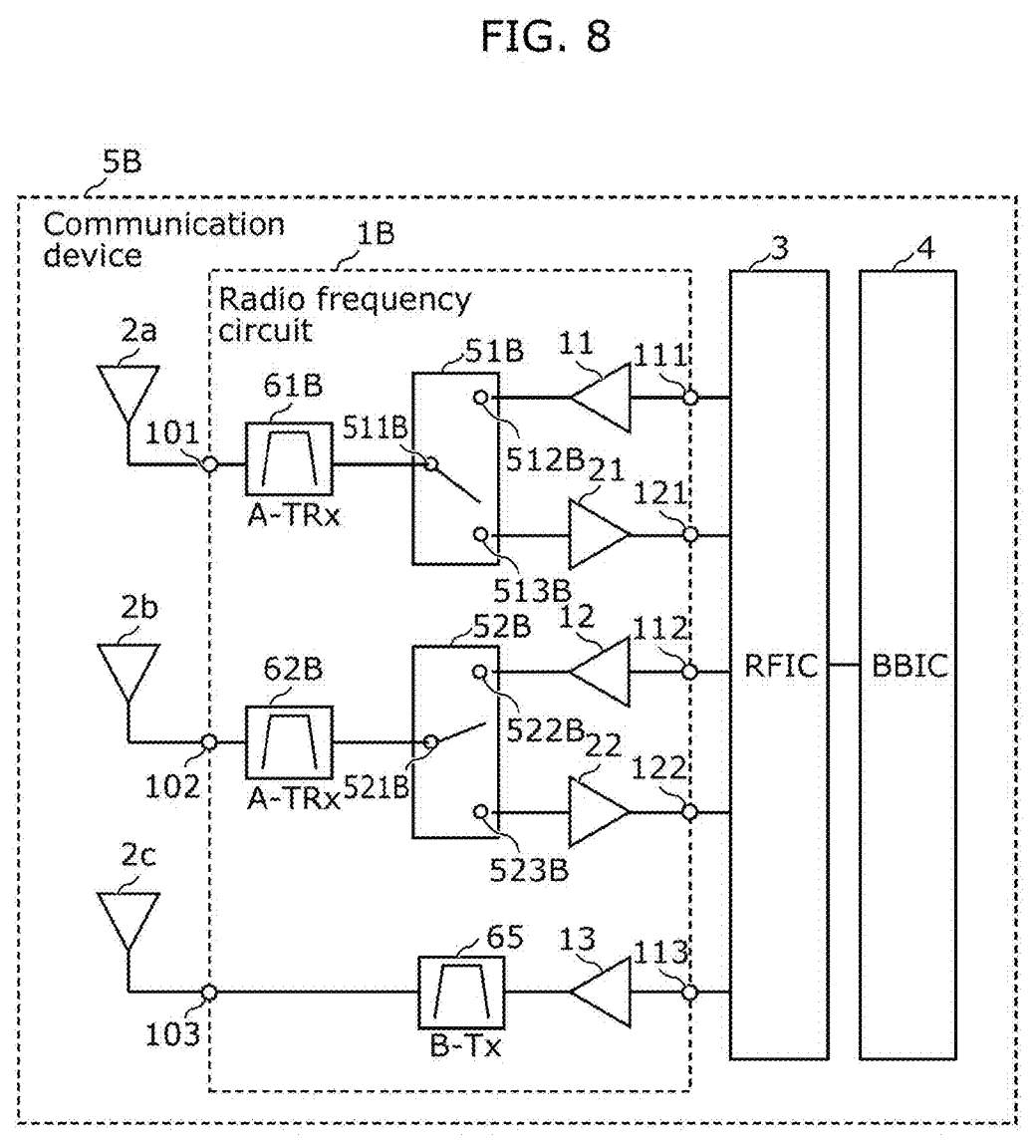

A circuit configuration of radio frequency circuit 1B according to this variation is to be described with reference to FIG. 8. FIG. 8 illustrates a circuit configuration of radio frequency circuit 1B and communication device 5B according to this variation. Note that a circuit configuration of communication device 5B is the same as that of communication device 5 according to Embodiment 1 except that radio frequency circuit 1B is included instead of radio frequency circuit 1, and thus description thereof is omitted.

As illustrated in FIG. 8, radio frequency circuit 1B according to this variation includes power amplifiers 11 to 13, low-noise amplifiers 21 and 22, switches 51B and 52B, filters 61B, 62B, and 65, antenna connection terminals 101 to 103, radio frequency input terminals 111 to 113, and radio frequency output terminals 121 and 122.

Switch 51B is connected between (i) filter 61B and (ii) power amplifier 11 and low-noise amplifier 21. Specifically, switch 51B includes terminals 511B to 513B. Terminal 511B is connected to filter 61B. Terminal 512B is connected to power amplifier 11. Terminal 513B is connected to low-noise amplifier 21.

With this connection configuration, switch 51B can connect terminal 511B to any one of terminal 512B or terminal 513B, based on a control signal from RFIC 3, for example. Thus, switch 51B can switch connection of filter 61B between power amplifier 11 and low-noise amplifier 21. For example, an SPDT switch circuit can be used as switch 51B.

Switch 52B is connected between (i) filter 62B and (ii) power amplifier 12 and low-noise amplifier 22. Specifically, switch 52B includes terminals 521B to 523B. Terminal 521B is connected to filter 62B. Terminal 522B is connected to power amplifier 12. Terminal 523B is connected to low-noise amplifier 22.

With this connection configuration, switch 52B can connect terminal 521B to any one of terminal 522B or terminal 523B, based on a control signal from RFIC 3, for example. Thus, switch 52B can switch connection of filter 62B between power amplifier 12 and low-noise amplifier 22. For example, an SPDT switch circuit can be used as switch 52B.

For example, assuming an SRS in band A is transmitted via antenna 2a, switch 51B connects terminal 511B to terminal 512B. For example, assuming an SRS in band A is transmitted via antenna 2b, switch 52B connects terminal 521B to terminal 522B. For example, assuming DL-MIMO in band A is performed, switch 51B connects terminal 511B to terminal 513B, and switch 52B connects terminal 521B to terminal 523B.

Filter 61B (A-TRx) functions as filters 61 and 63 in Embodiment 1 above, and has a passband that includes band A. Filter 61B is connected between (i) antenna connection terminal 101 and (ii) power amplifier 11 and low-noise amplifier 21. Specifically, an end of filter 61B is connected to antenna connection terminal 101, and the other end of filter 61B is connected to terminal 511B of switch 51B. Filter 61B can pass transmission signals in band A amplified by power amplifier 11, and can pass reception signals in band A received by antenna 2a.

Filter 62B (A-TRx) functions as filters 62 and 64 in Embodiment 1 above, and has a passband that includes band A. Filter 62B is connected between (i) antenna connection terminal 102 and (ii) power amplifier 12 and low-noise amplifier 22. Specifically, an end of filter 62B is connected to antenna connection terminal 102, and the other end of filter 62B is connected to terminal 521B of switch 52B. Filter 62B can pass transmission signals in band A amplified by power amplifier 12, and can pass reception signals in band A received by antenna 2b.

3.2 Advantageous Effects and Others

As described above, in radio frequency circuit 1B according to this variation, power amplifier 11 and low-noise amplifier 21 are connected to antenna connection terminal 101 via switch 51B and filter 61B, and power amplifier 12 and low-noise amplifier 22 are connected to antenna connection terminal 102 via switch 52B and filter 62B.

According to this, radio frequency circuit 1B can achieve the functions of two filters 61 and 63 in Embodiment 1 above by using single filter 61B, and can achieve the functions of two filters 62 and 64 in Embodiment 1 above by using single filter 62B. Thus, the number of filters included in radio frequency circuit 1B can be decreased.

Embodiment 2

Next, Embodiment 2 is to be described. The exemplary embodiment is different from Embodiment 1 above mainly in that 4×4 DL-MIMO in band A is supported. The following describes the exemplary embodiment with reference to the drawings, focusing on differences from Embodiment 1 above.

Figure 9:
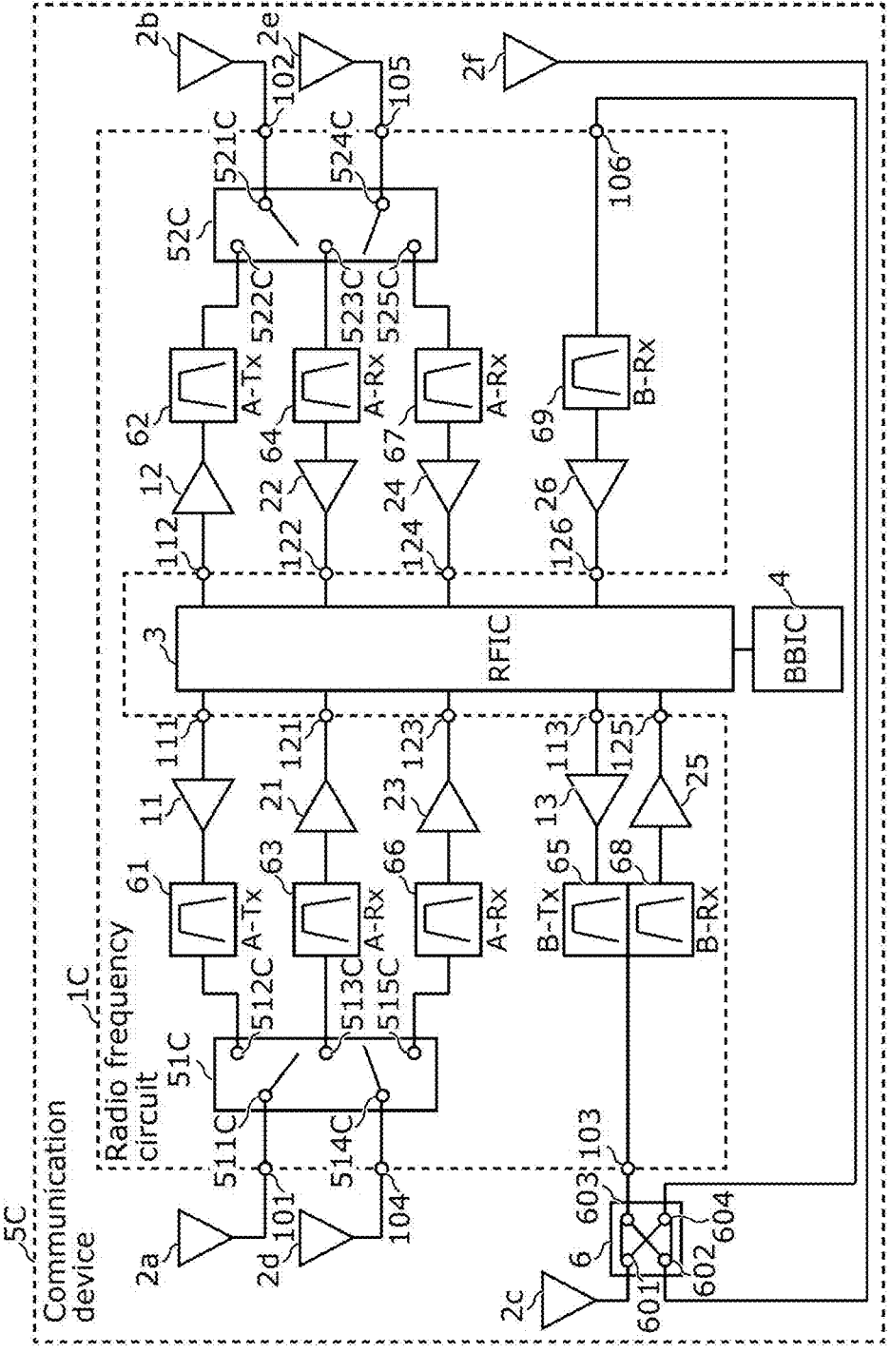
FIG. 9 illustrates a circuit configuration of a radio frequency circuit and a communication device according to Embodiment 2.

4.1 Circuit Configuration of Radio Frequency Circuit 1C and Communication Device 5C A circuit configuration of radio frequency circuit 1C and communication device 5C according to the exemplary embodiment is to be described with reference to FIG. 9. FIG. 9 illustrates a circuit configuration of radio frequency circuit 1C and communication device 5C according to the exemplary embodiment.

4.1.1 Circuit Configuration of Communication Device 5C

First, a circuit configuration of communication device 5C is to be described. Communication device 5C is an example of UE or an MS, and supports simultaneous communication using 4×4 DL-MIMO in band A and uplink communication in band B.

As illustrated in FIG. 9, communication device 5C includes radio frequency circuit 1C, antennas 2a to 2f, RFIC 3, BBIC 4, and switch 6.

Antennas 2a, 2b, 2d, and 2e are connected to antenna connection terminals 101, 102, 104, and 105 of radio frequency circuit 1C, respectively. Antenna 2c is connected to one of antenna connection terminal 103 or 106 via switch 6, and antenna 2f is connected to the other one of antenna connection terminal 103 or 106 via switch 6. Antennas 2a to 2f receive radio frequency signals from radio frequency circuit 1C and output the radio frequency signals to the outside of communication device 5C and/or receive radio frequency signals from the outside of communication device 5C and output the radio frequency signals to radio frequency circuit 1C.

Switch 6 is connected between antennas 2c and 2f and radio frequency circuit 1C. Specifically, switch 6 includes terminals 601 to 604. Terminal 601 is connected to antenna 2c. Terminal 602 is connected to antenna 2f. Terminal 603 is connected to antenna connection terminal 103. Terminal 604 is connected to antenna connection terminal 106.

With this connection configuration, switch 6 can connect terminal 601 to one of terminal 603 or 604 and connect terminal 602 to the other one of terminal 603 or 604, based on a control signal from RFIC 3, for example.

Note that antennas 2a to 2f, BBIC 4, and switch 6 are not necessarily included in communication device 5C according to the exemplary embodiment. Furthermore, switch 6 may be included in radio frequency circuit 1C.

4.1.2 Circuit Configuration of Radio Frequency Circuit 1C

Next, a circuit configuration of radio frequency circuit 1C is to be described. Radio frequency circuit 1C supports simultaneous communication using 4×4 DL-MIMO in band A and uplink communication in band B. As illustrated in FIG. 9, radio frequency circuit 1C includes power amplifiers 11 to 13, low-noise amplifiers 21 to 26, switches 51C and 52C, filters 61 to 69, antenna connection terminals 101 to 106, radio frequency input terminals 111 to 113, and radio frequency output terminals 121 to 126.

Antenna connection terminal 104 is an example of a fourth antenna connection terminal, and is connected to antenna 2d outside radio frequency circuit 1C. Antenna connection terminal 105 is an example of a fifth antenna connection terminal, and is connected to antenna 2e outside radio frequency circuit 1C. Antenna connection terminals 103 and 106 are connected to antennas 2c and 2f outside radio frequency circuit 1C.

Radio frequency output terminals 123 to 126 are for providing radio frequency reception signals to the outside of radio frequency circuit 1C. In the exemplary embodiment, radio frequency output terminals 123 to 126 are connected to RFIC 3 outside radio frequency circuit 1C.

Low-noise amplifier 23 is an example of a third low-noise amplifier, and is connected to antenna connection terminal 104 via filter 66 and switch 51C. Specifically, the input end of low-noise amplifier 23 is connected to filter 66, whereas the output end of low-noise amplifier 23 is connected to radio frequency output terminal 123. Low-noise amplifier 23 can amplify reception signals in band A.

Low-noise amplifier 24 is an example of a fourth low-noise amplifier, and is connected to antenna connection terminal 105 via filter 67 and switch 52C. Specifically, the input end of low-noise amplifier 24 is connected to filter 67, whereas the output end of low-noise amplifier 24 is connected to radio frequency output terminal 124. Low-noise amplifier 24 can amplify reception signals in band A.

Low-noise amplifier 25 is connected to antenna connection terminal 103 via filter 68. Specifically, the input end of low-noise amplifier 25 is connected to filter 68, whereas the output end of low-noise amplifier 25 is connected to radio frequency output terminal 125. Low-noise amplifier 25 can amplify reception signals in band B.

Low-noise amplifier 26 is connected to antenna connection terminal 106 via filter 69. Specifically, the input end of low-noise amplifier 26 is connected to filter 69, whereas the output end of low-noise amplifier 26 is connected to radio frequency output terminal 126. Low-noise amplifier 26 can amplify reception signals in band B.

Switch 51C is an example of a first switch, and is connected between (i) antenna connection terminals 101 and 104 and (ii) filters 61, 63, and 66. Specifically, switch 51C includes terminals 511C to 515C. Terminal 511C is connected to antenna connection terminal 101. Terminal 512C is connected to filter 61. Terminal 513C is connected to filter 63. Terminal 514C is connected to antenna connection terminal 104. Terminal 515C is connected to filter 66.

With this connection configuration, switch 51C can connect terminal 511C to any one of terminal 512C, 513C, or 515C and connect terminal 514C to any other one of terminal 512C, 513C, or 515C, based on a control signal from RFIC 3, for example. Thus, switch 51C can switch connection of antenna connection terminal 101 between filters 61, 63, and 66, and can switch connection of antenna connection terminal 104 between filters 61, 63, and 66.

Switch 52C is an example of a second switch, and is connected between (i) antenna connection terminals 102 and 105 and (ii) filters 62, 64, and 67. Specifically, switch 52C includes terminals 521C to 525C. Terminal 521C is connected to antenna connection terminal 102. Terminal 522C is connected to filter 62. Terminal 523C is connected to filter 64. Terminal 524C is connected to antenna connection terminal 105. Terminal 525C is connected to filter 67.

With this connection configuration, switch 52C can connect terminal 521C to any one of terminal 522C, 523C, or 525C and connect terminal 524C to any other one of terminal 522C, 523C, or 525C, based on a control signal from RFIC 3, for example. Thus, switch 52C can switch connection of antenna connection terminal 102 between filters 62, 64, and 67, and can switch connection of antenna connection terminal 105 between filters 62, 64, and 67.

Filter 66 (A-Rx) is an example of a sixth filter, and has a passband that includes at least a portion of band A. For example, assuming band A is a band for TDD, the passband of filter 66 includes band A. For example, assuming band A is a band for FDD, the passband of filter 66 includes the downlink operating band in band A. Filter 66 is connected between antenna connection terminal 104 and low-noise amplifier 23. Specifically, an end of filter 66 is connected to terminal 515C of switch 51C, and the other end of filter 66 is connected to the input end of low-noise amplifier 23. Filter 66 can pass reception signals in band A, which are received by antenna 2d.

Filter 67 (A-Rx) is an example of a seventh filter, and has a passband that includes at least a portion of band A. For example, assuming band A is a band for TDD, the passband of filter 67 includes band A. For example, assuming band A is a band for FDD, the passband of filter 67 includes the downlink operating band in band A. Filter 67 is connected between antenna connection terminal 105 and low-noise amplifier 24. Specifically, an end of filter 67 is connected to terminal 525C of switch 52C, and the other end of filter 67 is connected to the input end of low-noise amplifier 24. Filter 67 can pass reception signals in band A, which are received by antenna 2e.

Filter 68 (B-Rx) is an example of an eighth filter, and has a passband that includes at least a portion of band B. In the exemplary embodiment, the passband of filter 68 includes the downlink operating band in band B that is a band for FDD. Filter 68 is connected between antenna connection terminal 103 and low-noise amplifier 25. Specifically, an end of filter 68 is connected to antenna connection terminal 103, and the other end of filter 68 is connected to the input end of low-noise amplifier 25. Filter 68 can pass reception signals in band B, which are received by antenna 2c and/or antenna 2f.

Filter 69 (B-Rx) is an example of a ninth filter, and has a passband that includes at least a portion of band B. In the exemplary embodiment, the passband of filter 69 includes the downlink operating band in band B that is a band for FDD. Filter 69 is connected between antenna connection terminal 106 and low-noise amplifier 26. Specifically, an end of filter 69 is connected to antenna connection terminal 106, and the other end of filter 69 is connected to the input end of low-noise amplifier 26. Filter 69 can pass reception signals in band B, which are received by antenna 2c and/or antenna 2f.

4.2 Operation of Communication Device 5C

Next, operation of (that is, a communication method performed by) communication device 5C configured as above is to be described with reference to FIG. 2. Specifically, processing for establishing 4×4 DL-MIMO in band A is to be described.

First, the UE (that is, communication device 5C) obtains deterioration amounts of the S/N ratio in band A due to distortion of a transmission signal in band B that has leaked out from antenna 2c and leaked in via antennas 2a, 2b, 2d, and 2e, with reference to information on the deterioration amounts of the S/N ratio stored in a storage medium (S101). The UE refers to the information as illustrated in FIG. 10, for example, and obtains −26 dB, −6 dB, −16 dB, and −3 dB as deterioration amounts of the S/N ratio in band A due to distortion of a transmission signal in band B that has leaked out from antenna 2c and leaked in via antennas 2a, 2b, 2d, and 2e.

FIG. 10 illustrates an example of information stored in the storage medium in the exemplary embodiment. In FIG. 10, −26 dB, −6 dB, −16 dB, and −3 dB are recorded as deterioration amounts of the S/N ratio in band A due to distortion of a transmission signal in band B that has leaked out from antenna 2c and leaked in via antennas 2a, 2b, 2d, and 2e. Furthermore, −16 dB, −3 dB, −26 dB, and −6 dB are recorded as deterioration amounts of the S/N ratio in band A due to distortion of a transmission signal in band B that has leaked out from antenna 2f and leaked in antennas 2a, 2b, 2d, and 2e.

The UE determines, according to the obtained deterioration amount, output power of an SRS to be transmitted via one of the antennas associated therewith (S102). For example, the UE determines the output power of the SRS to have less output power with an increase in the deterioration amount.

At this time, assuming the deterioration amount (a first deterioration amount) associated with antenna 2a is greater than the deterioration amount (a second deterioration amount) associated with antenna 2b, the output power of the first SRS transmitted via antenna 2a is less than the output power of the second SRS transmitted via antenna 2b. On the other hand, assuming the deterioration amount (the first deterioration amount) associated with antenna 2a is less than the deterioration amount (the second deterioration amount) associated with antenna 2b, the output power of the first SRS transmitted via antenna 2a is greater than the output power of the second SRS transmitted via antenna 2b.

Furthermore, assuming the deterioration amount (the first deterioration amount) associated with antenna 2a is greater than the deterioration amount (a third deterioration amount) associated with antenna 2d, the output power of the first SRS transmitted via antenna 2a is less than the output power of a third SRS transmitted via antenna 2d. On the other hand, assuming the deterioration amount (the first deterioration amount) associated with antenna 2a is less than the deterioration amount (the third deterioration amount) associated with antenna 2d, the output power of the first SRS transmitted via antenna 2a is greater than the output power of the third SRS transmitted via antenna 2d.

Furthermore, assuming the deterioration amount (the first deterioration amount) associated with antenna 2a is greater than the deterioration amount (a fourth deterioration amount) associated with antenna 2e, the output power of the first SRS transmitted via antenna 2a is less than the output power of a fourth SRS transmitted via antenna 2e. On the other hand, assuming the deterioration amount (the first deterioration amount) associated with antenna 2a is less than the deterioration amount (the fourth deterioration amount) associated with antenna 2e, the output power of the first SRS transmitted via antenna 2a is greater than the output power of the fourth SRS transmitted via antenna 2e.

Furthermore, assuming the deterioration amount (the second deterioration amount) associated with antenna 2b is greater than the deterioration amount (the third deterioration amount) associated with antenna 2d, the output power of the second SRS transmitted via antenna 2b is less than the output power of the third SRS transmitted via antenna 2d. On the other hand, assuming the deterioration amount (the second deterioration amount) associated with antenna 2b is less than the deterioration amount (the third deterioration amount) associated with antenna 2d, the output power of the second SRS transmitted via antenna 2b is greater than the output power of the third SRS transmitted via antenna 2d.

Furthermore, assuming the deterioration amount (the second deterioration amount) associated with antenna 2b is greater than the deterioration amount (the fourth deterioration amount) associated with antenna 2e, the output power of the second SRS transmitted via antenna 2b is less than the output power of the fourth SRS transmitted via antenna 2e. On the other hand, assuming the deterioration amount (the second deterioration amount) associated with antenna 2b is less than the deterioration amount (the fourth deterioration amount) associated with antenna 2e, the output power of the second SRS transmitted via antenna 2b is greater than the output power of the fourth SRS transmitted via antenna 2e.

Furthermore, assuming the deterioration amount (the third deterioration amount) associated with antenna 2d is greater than the deterioration amount (the fourth deterioration amount) associated with antenna 2e, the output power of the third SRS transmitted via antenna 2d is less than the output power of the fourth SRS transmitted via antenna 2e. On the other hand, assuming the deterioration amount (the third deterioration associated with antenna 2d is less than the amount) deterioration amount (the fourth deterioration amount) associated with antenna 2e, the output power of the third SRS transmitted via antenna 2d is greater than the output power of the fourth SRS transmitted via antenna 2e.

Next, the UE amplifies the SRSs based on output power of the SRSs determined for the antennas, and transmits, to the BS, the amplified SRSs each via a corresponding one of the antennas (S103).

The BS receives the SRSs transmitted from the UE using different antennas, estimates quality of the channels based on the SRSs, and determines, for instance, power allocation in DL-MIMO (S104). Finally, DL-MIMO is performed according to the determined power allocation (S105).

4.3 Advantageous Effects and Others

As described above, radio frequency circuit 1C according to the exemplary embodiment further includes: low-noise amplifier 23 connected to antenna connection terminal 104; and low-noise amplifier 24 connected to antenna connection terminal 105. Power amplifier 11 is connected to antenna connection terminal 101 and antenna connection terminal 104, and power amplifier 12 is connected to antenna connection terminal 102 and antenna connection terminal 105. Under a condition that a third SRS in band A is output through antenna connection terminal 104, power amplifier 11 is configured to amplify the third SRS, according to a third deterioration amount of the S/N ratio in band A due to the distortion of the transmission signal in band B that has leaked in through antenna connection terminal 104. Under a condition that a fourth SRS in band A is output through antenna connection terminal 105, power amplifier 12 is configured to amplify the fourth SRS, according to a fourth deterioration amount of the S/N ratio in band A due to the distortion of the transmission signal in band B that has leaked in through antenna connection terminal 105.

According to this, in radio frequency circuit 1C that supports 4×4 DL-MIMO, similarly to Embodiment 1 above, performance of 4×4 DL-MIMO can be effectively improved in a situation in which the S/N ratio deteriorates.

For example, in radio frequency circuit 1C according to the exemplary embodiment, under a condition that the third deterioration amount is greater than the fourth deterioration amount, output power of the third SRS may be less than output power of the fourth SRS, and under a condition that the third deterioration amount is less than the fourth deterioration amount, the output power of the third SRS may be greater than the output power of the fourth SRS.

According to this, by decreasing the output power of an SRS that is output through an antenna associated with a greater deterioration amount of the S/N ratio, deterioration of the S/N ratio due to a transmission signal in band B can be reflected in channel quality.

For example, in radio frequency circuit 1C according to the exemplary embodiment, power amplifier 11 may be configured to amplify the third SRS to decrease the output power of the third SRS with an increase in the third deterioration amount, and power amplifier 12 may be configured to amplify the fourth SRS to decrease the output power of the fourth SRS with an increase in the fourth deterioration amount.

According to this, the output power of an SRS can be decreased with an increase in the deterioration amount of the S/N ratio, and deterioration of the S/N ratio can be reflected in channel quality.

For example, in radio frequency circuit 1C according to the exemplary embodiment, power amplifier 11 may be configured to amplify the third SRS to cause the output power of the third SRS to have a value obtained by attenuating predetermined output power by power corresponding to the third deterioration amount, and power amplifier 12 may be configured to amplify the fourth SRS to cause the output power of the fourth SRS to have a value obtained by attenuating the predetermined output power by power corresponding to the fourth deterioration amount.

According to this, an SRS having a value obtained by attenuating predetermined output power by power according to the deterioration amount can be transmitted, and the deterioration of the S/N ratio can be reflected in channel quality.

For example, radio frequency circuit 1C according to the exemplary embodiment may further include: power amplifier 13 connected to antenna connection terminal 103; filters 61 to 64, 66, and 67 each having a passband that includes at least a portion of band A; and filter 65 having a passband that includes at least a portion of band B. Power amplifier 11 may be connected to antenna connection terminal 101 and antenna connection terminal 104 via filter 64, power amplifier 12 may be connected to antenna connection terminal 102 and antenna connection terminal 105 via filter 62, power amplifier 13 may be connected to antenna connection terminal 103 via filter 65, low-noise amplifier 21 may be connected to antenna connection terminal 101 via filter 63, low-noise amplifier 22 may be connected to antenna connection terminal 102 via filter 64, low-noise amplifier 23 may be connected to antenna connection terminal 104 via filter 66, and low-noise amplifier 24 may be connected to antenna connection terminal 105 via filter 67.

According to this, isolation between the transmission paths and the reception paths can be improved.

For example, radio frequency circuit 1C according to the exemplary embodiment may further include: switch 51C connected between (i) filter 61, filter 63, and filter 66 and (ii) antenna connection terminal 101 and antenna connection terminal 104; and switch 52C connected between (i) filter 62, filter 64, and filter 67 and (ii) antenna connection terminal 102 and antenna connection terminal 105.

According to this, isolation between the transmission paths and the reception paths can be improved.

For example, radio frequency circuit 1C according to the exemplary embodiment may further include: filter 68 having a passband that includes at least a portion of band B; and low-noise amplifier 25 connected to antenna connection terminal 103 via filter 68.

According to this, radio frequency circuit 1C can further support downlink transmission in band B.

For example, radio frequency circuit 1C according to the exemplary embodiment may further include: antenna connection terminal 106 connected to antenna 2f; filter 69 having a passband that includes at least a portion of band B; and low-noise amplifier 26 connected to antenna connection terminal 106 via filter 69.

According to this, radio frequency circuit 1C can further support 2×2 DL-MIMO in band B.

OTHER EMBODIMENTS

The above has described the radio frequency circuits and the communication devices according to the present disclosure based on the embodiments, yet the radio frequency circuits and the communication devices according to the present disclosure are not limited to the above embodiments. The present disclosure also encompasses other embodiments resulting from combining arbitrary elements in the above embodiments, variations resulting from applying, to the above embodiments, various modifications that may be conceived by those skilled in the art within a range that does not depart from the scope of the present disclosure, and various devices that each include a radio frequency circuit as above.

For example, in the circuit configurations of the radio frequency circuits and the communication devices according to the embodiments, another circuit element and another line, for instance, may be disposed between circuit elements and paths connecting signal paths, which are illustrated in the drawings. For example, an impedance matching circuit may be disposed between filter 61 and power amplifier circuit 11 and/or between filter 62 and power amplifier circuit 12. In addition, an impedance matching circuit may be disposed between filter 63 and low-noise amplifier circuit 21 and/or between filter 64 and low-noise amplifier circuit 22. Similarly, an impedance matching circuit may be disposed between another circuit element and a circuit element as above. The impedance matching circuit may include an inductor and/or a capacitor, for example.

Note that Variation 1 or 2 of Embodiment 1 above may be applied to Embodiment 2 above. For example, assuming Variation 1 is applied to Embodiment 2, radio frequency circuit 1C may not include one of power amplifier 11 or 12. For example, assuming Variation 2 is applied to Embodiment 2, radio frequency circuit 1C may not include both of filters 63 and 64.

Note that in the above embodiments, information stored in the storage medium includes a deterioration amount, but items stored therein are not limited thereto. For example, the information may include a magnitude of distortion (for example, second harmonic distortion) of a transmission signal in band B and isolation between antennas. For example, the information may include output power of an SRS in band A. Thus, the information may not include a deterioration amount itself, and may include information on a deterioration amount, with which the deterioration amount can be derived.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion.

The invention claimed is:

1. A radio frequency circuit configured to support simultaneous communication using downlink Multiple Input Multiple Output (MIMO) in a first band and uplink communication in a second band, the radio frequency circuit comprising:
a first power amplifier connected to a first antenna connection terminal;
a second power amplifier connected to a second antenna connection terminal;
a first low-noise amplifier connected to the first antenna connection terminal; and
a second low-noise amplifier connected to the second antenna connection terminal,
wherein under a condition that a first sounding reference signal in the first band is output through the first antenna connection terminal, the first power amplifier is configured to amplify the first sounding reference signal, according to a first deterioration amount of a signal-to-noise ratio in the first band due to distortion of a transmission signal in the second band that has leaked in through the first antenna connection terminal, and
under a condition that a second sounding reference signal in the first band is output through the second antenna connection terminal, the second power amplifier is configured to amplify the second sounding reference signal, according to a second deterioration amount of the signal-to-noise ratio in the first band due to the distortion of the transmission signal in the second band that has leaked in through the second antenna connection terminal.

2. The radio frequency circuit according to claim 1, wherein under a condition that the first deterioration amount is greater than the second deterioration amount, output power of the first sounding reference signal is less than output power of the second sounding reference signal, and
under a condition that the first deterioration amount is less than the second deterioration amount, the output power of the first sounding reference signal is greater than the output power of the second sounding reference signal.

3. The radio frequency circuit according to claim 2, wherein the first power amplifier is configured to amplify the first sounding reference signal to decrease the output power of the first sounding reference signal with an increase in the first deterioration amount, and the second power amplifier is configured to amplify the second sounding reference signal to decrease the output power of the second sounding reference signal with an increase in the second deterioration amount.

4. The radio frequency circuit according to claim 3, wherein the first power amplifier is configured to amplify the first sounding reference signal to cause the output power of the first sounding reference signal to have a value obtained by attenuating predetermined output power by power corresponding to the first deterioration amount, and
the second power amplifier is configured to amplify the second sounding reference signal to cause the output power of the second sounding reference signal to have a value obtained by attenuating the predetermined output power by power corresponding to the second deterioration amount.

5. The radio frequency circuit according to claim 1, wherein information on the first deterioration amount and the second deterioration amount is stored in a storage medium.

6. The radio frequency circuit according to claim 1, further comprising:
a third power amplifier connected to a third antenna connection terminal;
a first filter, a second filter, a third filter, and a fourth filter each having a passband that includes at least a portion of the first band; and
a fifth filter having a passband that includes at least a portion of the second band,
wherein the first power amplifier is connected to the first antenna connection terminal via the first filter,
the second power amplifier is connected to the second antenna connection terminal via the second filter,
the first low-noise amplifier is connected to the first antenna connection terminal via the third filter,
the second low-noise amplifier is connected to the second antenna connection terminal via the fourth filter, and
the third power amplifier is connected to the third antenna connection terminal via the fifth filter.

7. The radio frequency circuit according to claim 6, further comprising:
a first switch connected between (i) the first antenna connection terminal and (ii) the first filter and the third filter; and
a second switch connected between (i) the second antenna connection terminal and (ii) the second filter and the fourth filter.

8. The radio frequency circuit according to claim 1, further comprising:
a third low-noise amplifier connected to a fourth antenna connection terminal; and
a fourth low-noise amplifier connected to a fifth antenna connection terminal,
wherein the first power amplifier is connected to the first antenna connection terminal and the fourth antenna connection terminal,
the second power amplifier is connected to the second antenna connection terminal and the fifth antenna connection terminal,
under a condition that a third sounding reference signal in the first band is output through the fourth antenna connection terminal, the first power amplifier is configured to amplify the third sounding reference signal, according to a third deterioration amount of the signal-to-noise ratio in the first band due to the distortion of the transmission signal in the second band that has leaked in through the fourth antenna connection terminal, and under a condition that a fourth sounding reference signal in the first band is output through the fifth antenna connection terminal, the second power amplifier is configured to amplify the fourth sounding reference signal, according to a fourth deterioration amount of the signal-to-noise ratio in the first band due to the distortion of the transmission signal in the second band that has leaked in through the fifth antenna connection terminal.

9. The radio frequency circuit according to claim 8, wherein under a condition that the third deterioration amount is greater than the fourth deterioration amount, output power of the third sounding reference signal is less than output power of the fourth sounding reference signal, and under a condition that the third deterioration amount is less than the fourth deterioration amount, the output power of the third sounding reference signal is greater than the output power of the fourth sounding reference signal.

10. The radio frequency circuit according to claim 9, wherein the first power amplifier is configured to amplify the third sounding reference signal to decrease the output power of the third sounding reference signal with an increase in the third deterioration amount, and the second power amplifier is configured to amplify the fourth sounding reference signal to decrease the output power of the fourth sounding reference signal with an increase in the fourth deterioration amount.

11. The radio frequency circuit according to claim 10, wherein the first power amplifier is configured to amplify the third sounding reference signal to cause the output power of the third sounding reference signal to have a value obtained by attenuating predetermined output power by power corresponding to the third deterioration amount, and the second power amplifier is configured to amplify the fourth sounding reference signal to cause the output power of the fourth sounding reference signal to have a value obtained by attenuating the predetermined output power by power corresponding to the fourth deterioration amount.

12. The radio frequency circuit according to claim 8, further comprising:

a third power amplifier connected to a third antenna connection terminal;

a first filter, a second filter, a third filter, a fourth filter, a sixth filter, and a seventh filter each having a passband that includes at least a portion of the first band; and a fifth filter having a passband that includes at least a portion of the second band, wherein the first power amplifier is connected to the first antenna connection terminal and the fourth antenna connection terminal via the first filter, the second power amplifier is connected to the second antenna connection terminal and the fifth antenna connection terminal via the second filter, the third power amplifier is connected to the third antenna connection terminal via the fifth filter, the first low-noise amplifier is connected to the first antenna connection terminal via the third filter, the second low-noise amplifier is connected to the second antenna connection terminal via the fourth filter, the third low-noise amplifier is connected to the fourth antenna connection terminal via the sixth filter, and the fourth low-noise amplifier is connected to the fifth antenna connection terminal via the seventh filter.

13. The radio frequency circuit according to claim 12, further comprising:

a first switch connected between (i) the first filter, the third filter, and the sixth filter and (ii) the first antenna connection terminal and the fourth antenna connection terminal; and a second switch connected between (i) the second filter, the fourth filter, and the seventh filter and (ii) the second antenna connection terminal and the fifth antenna connection terminal.

14. The radio frequency circuit according to claim 13, further comprising:

an eighth filter having a passband that includes at least a portion of the second band; and a fifth low-noise amplifier connected to the third antenna connection terminal via the eighth filter.

15. The radio frequency circuit according to claim 14, further comprising:

a sixth antenna connection terminal connected to a sixth antenna;

a ninth filter having a passband that includes at least a portion of the second band; and a sixth low-noise amplifier connected to the sixth antenna connection terminal via the ninth filter.

16. The radio frequency circuit according to claim 1, wherein the first band is n78 for Fifth Generation New Radio (5G NR), and the second band is Band 2, Band 3, Band 4, or Band 66 for Long Term Evolution (LTE).

17. The radio frequency circuit according to claim 1, wherein the first band is n77 for Fifth Generation New Radio (5G NR), and the second band is Band 1 or Band 3 for Long Term Evolution (LTE).

18. The radio frequency circuit according to claim 1, wherein the first band is n41 for Fifth Generation New Radio (5G NR), and the second band is Band 8 or Band 26 for Long Term Evolution (LTE).

19. A communication device comprising:

a signal processing circuit configured to process a radio frequency signal; and the radio frequency circuit according to claim 1 configured to transfer the radio frequency signal between the signal processing circuit and an antenna.

20. A method for controlling a radio frequency circuit configured to support simultaneous communication using downlink Multiple Input Multiple Output (MIMO) in a first band and uplink communication in a second band, the method comprising:

obtaining a first deterioration amount of a signal-to-noise ratio in the first band due to distortion of a transmission signal in the second band that has leaked in through a first antenna connection terminal;

amplifying a first sounding reference signal in the first band, according to the first deterioration amount obtained;

outputting the first sounding reference signal amplified through the first antenna connection terminal;

obtaining a second deterioration amount of the signal-to-noise ratio in the first band due to the distortion of the transmission signal in the second band that has leaked in through a second antenna connection terminal;

amplifying a second sounding reference signal in the first band, according to the second deterioration amount obtained; and outputting the second sounding reference signal amplified through the second antenna connection terminal.

* * * * *